Figure 1:
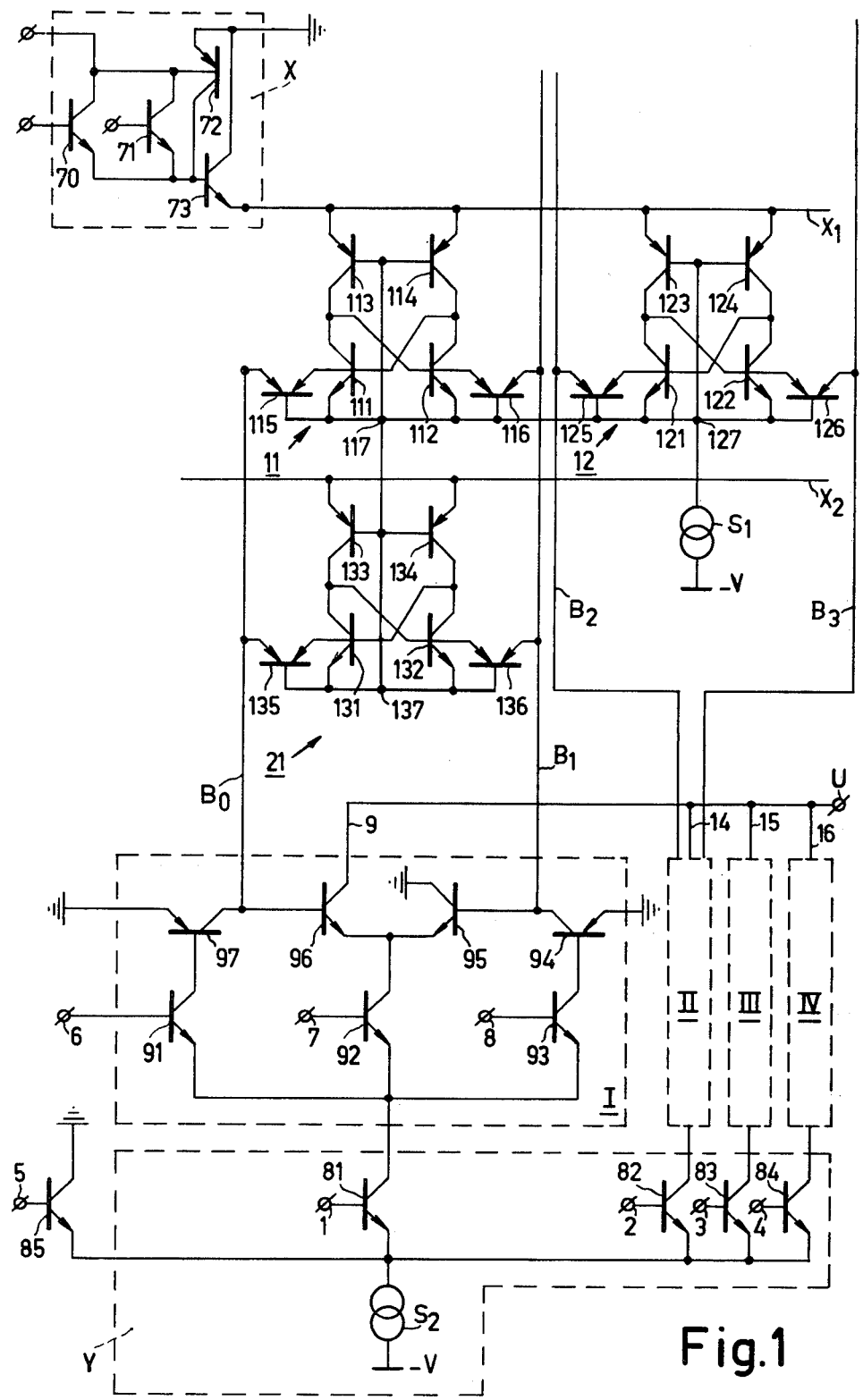

United States Patent [19]
Camerik et al.

[11] 4,122,542
[45] Oct. 24, 1978

[54] MEMORY ARRAY

[75] Inventors: Ferdinand Camerik; Cornelis Maria Hart; Arie Slob, all of Eindhoven, Netherlands

[73] Assignee: U.S. Philips Corporation, New York, N.Y.

[21] Appl. No.: 776,252

[22] Filed: Mar. 10, 1977

Related U.S. Application Data

[63] Continuation of Ser. No. 614,252, Sep. 17, 1975, abandoned, which is a continuation of Ser. No. 484,123, Jun. 28, 1974, abandoned.

[30] Foreign Application Priority Data

Jul. 6, 1973 [NL] Netherlands .......................... 7309453

[51] Int. Cl.² ............................................. G11C 11/40
[52] U.S. Cl. .................................... 365/156; 307/291; 365/154
[58] Field of Search ................ 340/173 FF; 307/238, 307/288, 291; 365/154, 156

[56] References Cited

U.S. PATENT DOCUMENTS 3,655,999 4/1972 Wiedmann ..................... 340/173 FF
3,745,540 7/1973 Taniguchi et al. ............ 340/173 FF
3,801,967 4/1974 Berger et al. .................. 340/173 FF

OTHER PUBLICATIONS

Wiedmann, Random Access Memory Cell, IBM Technical Disclosure Bulletin, 11/71, vol. 14, No. 6, pp. 1721-1722.
Wiedmann, High-Density Static Bipolar Memory, 1973, IEEE International Solid-State Circuits Conference, 2/14/73, pp. 56-57.

Primary Examiner—Stuart N. Hecker
Attorney, Agent, or Firm—Frank R. Trifari; Daniel R. McGlynn

[57] ABSTRACT

An integrated circuit memory array having a plurality of memory cells including two cross-coupled transistors of one conductivity type, load transistors of the other conductivity type, and a bit line, connected to the base region of one of the cross-coupled transistors through a bit line transistor. The array features a common node, directly interconnecting all of the base regions of the load transistors and the emitter regions of the cross-coupled transistors, for each of the memory cells; and a row selection line connected to the emitter regions of the load transistors in an associated row of memory cells.

3 Claims, 10 Drawing Figures

MEMORY ARRAY

This is a continuation of application Ser. No. 614,252, filed Sept. 17, 1975, now abandoned, which was a continuation of application Ser. No. 484,123, filed June 28, 1974, now abandoned.

The invention relates to a memory array built up from memory cells which each comprise two cross-coupled transistors of one conductivity type in the collector circuits of which load transistors of the other conductivity type are connected, at least one of the bases of the cross-coupled transistors being connected to an associated bit line via the main current path of a transistor the base of which is connected to the bases of the load transistors and to the emitter of the cross-coupled transistors so as to form a node, each memory cell being connected to an associated row selection line and to an associated column selection circuit.

A memory array of the above type is described for example, is ISSCC Digest of Technical Papers, Feb. 14, 1973, pages 56–57. In this known memory array the emitters of the load transistors are connected to a column conductor which serves for column selection of the memory array. The nodes of the memory cells in any one row are interconnected and, as is shown for example in FIG. 3 of the paper, are constituted by a single common n-type island provided with a buried layer and enclosed between two p-type isolating regions. The common n-type island is also used as row selection line of the associated row (X address, FIG. 1).

It is an object of the present invention to provide an improved memory of the abovedescribed type in which amongst other advantages a smaller number of lines is required for selection and which is particularly suited for manufacture in integrated-circuit form, may be particularly compact and requires a comparatively small semiconductor surface area.

A memory array of the abovedescribed type according to the invention is characterized in that the emitters of the load transistors in each memory cell are connected to the associated row selection line, the bit line of each memory cell being connected to the column selection circuit, while the nodes of all the memory cells are directly interconnected.

The step according to the invention ensures that when the array is integrated in the semiconductor chip no isolating regions are required between the memory cells of two adjacent rows, permitting a high packing density to be obtained. The entire memory array may be provided in a common semiconductor area, no rectifying junctions between adjacent memory cells or between the circuit elements of one memory cell being required for electric insulation.

Figure 2:
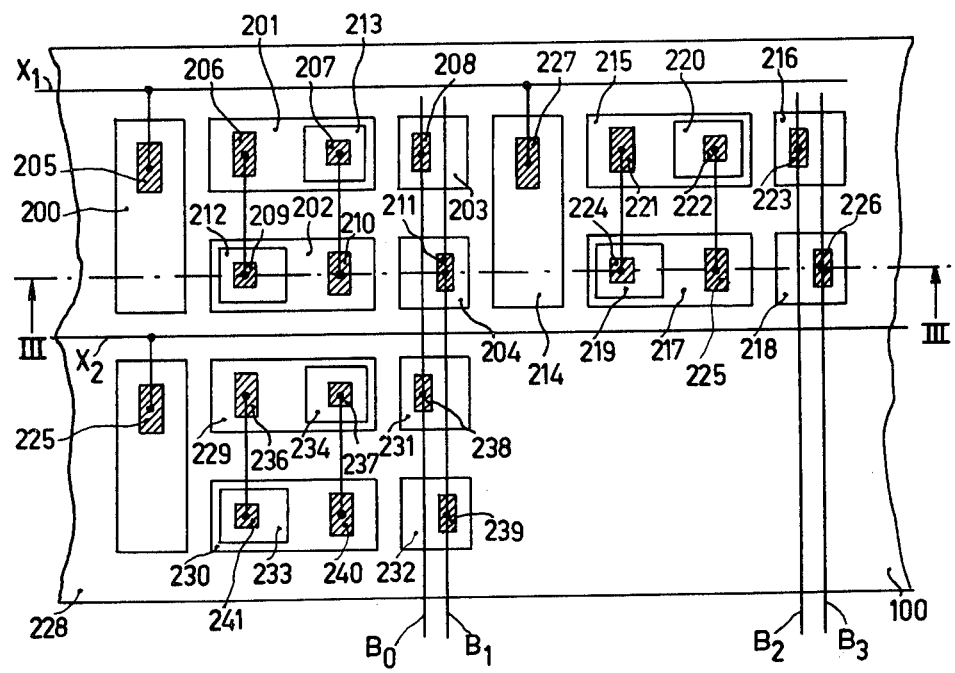
Figure 3:
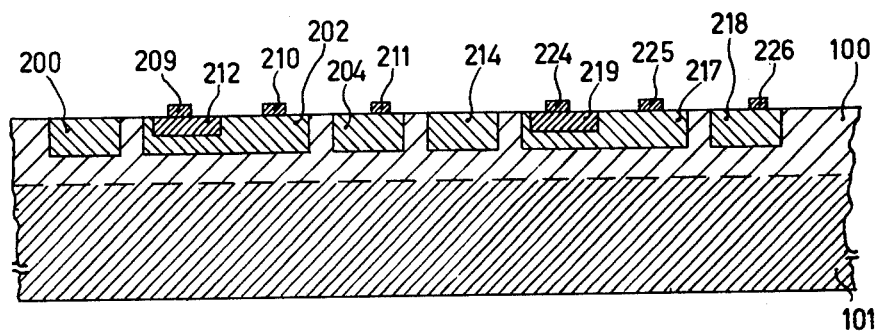
Figure 4:
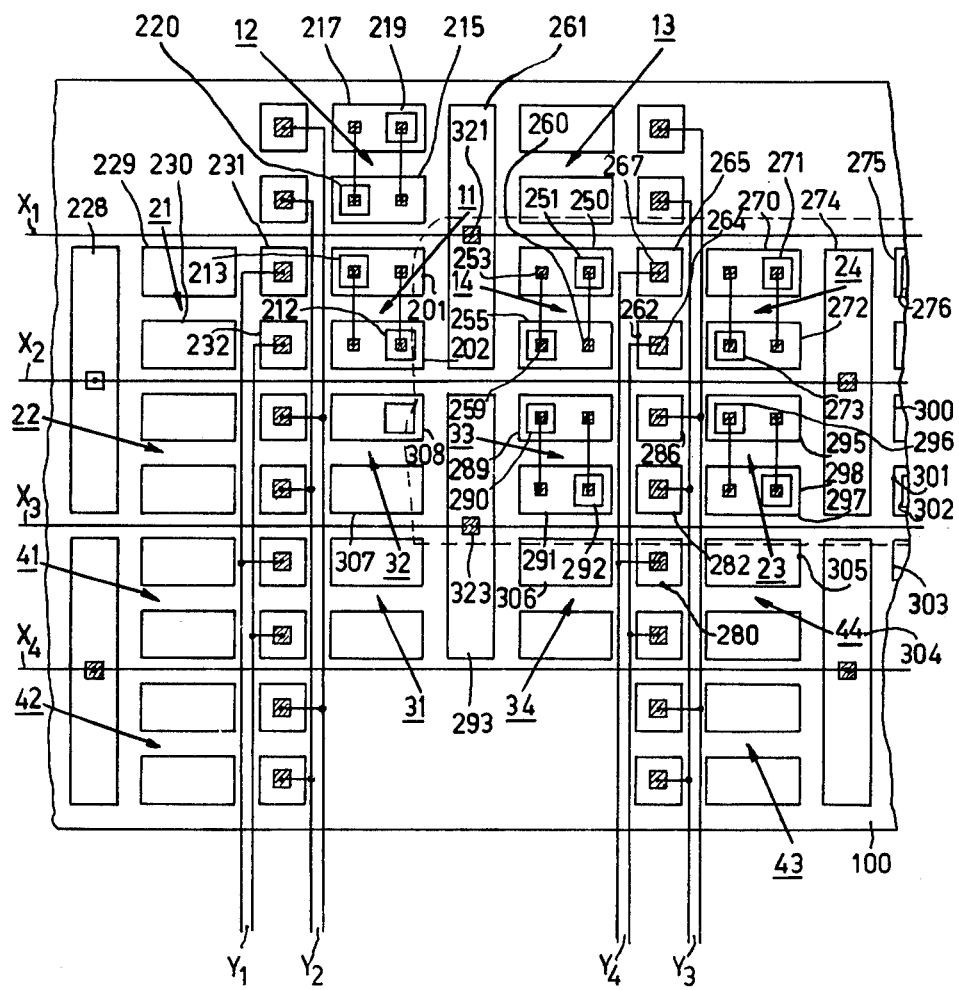
Figure 5:
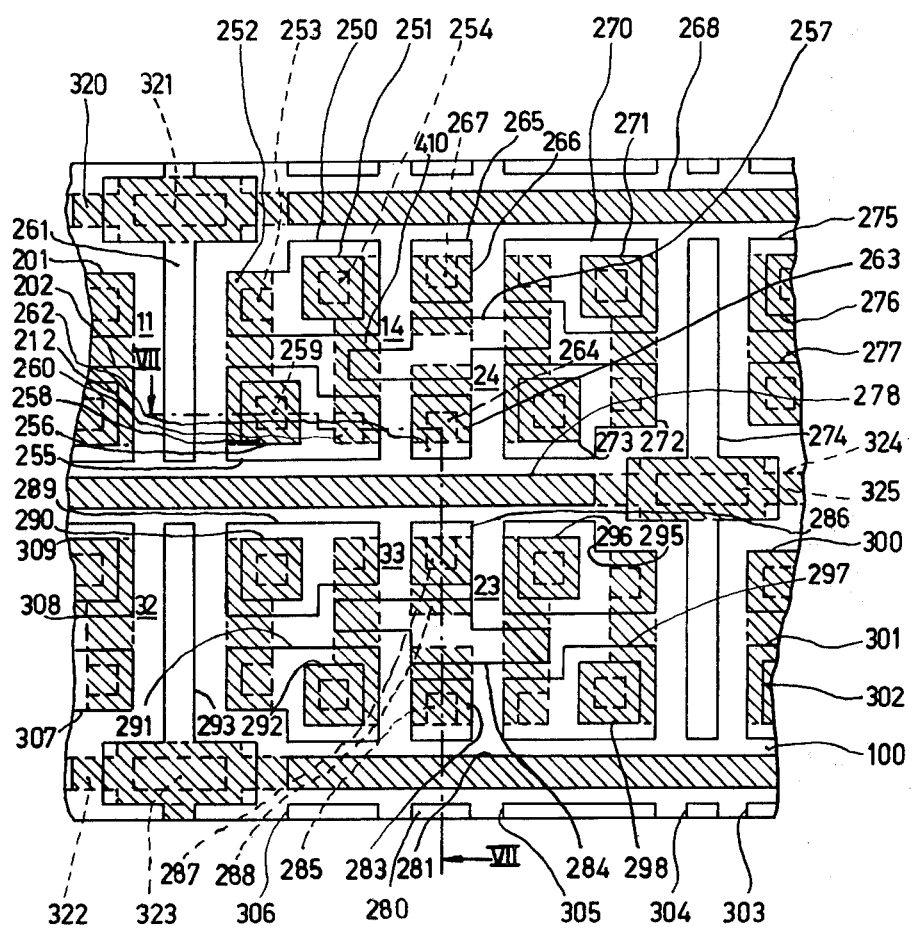
Figure 6:
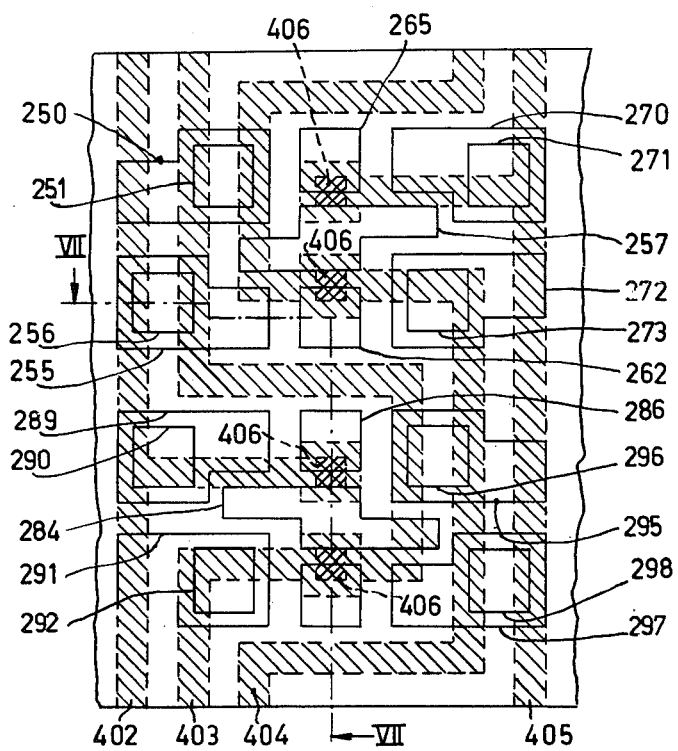
Figure 7:
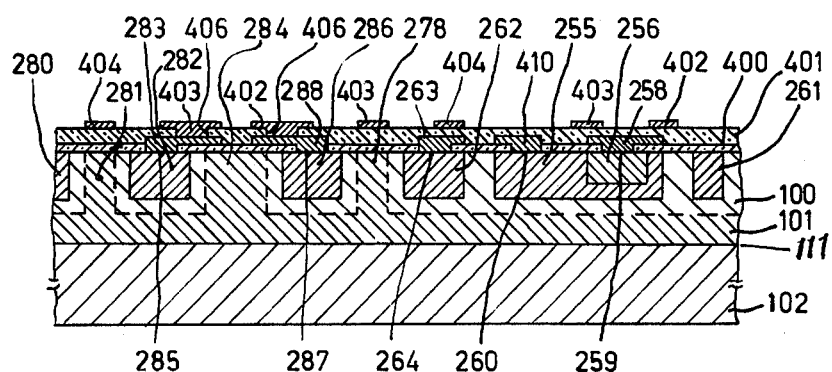
Figure 8:
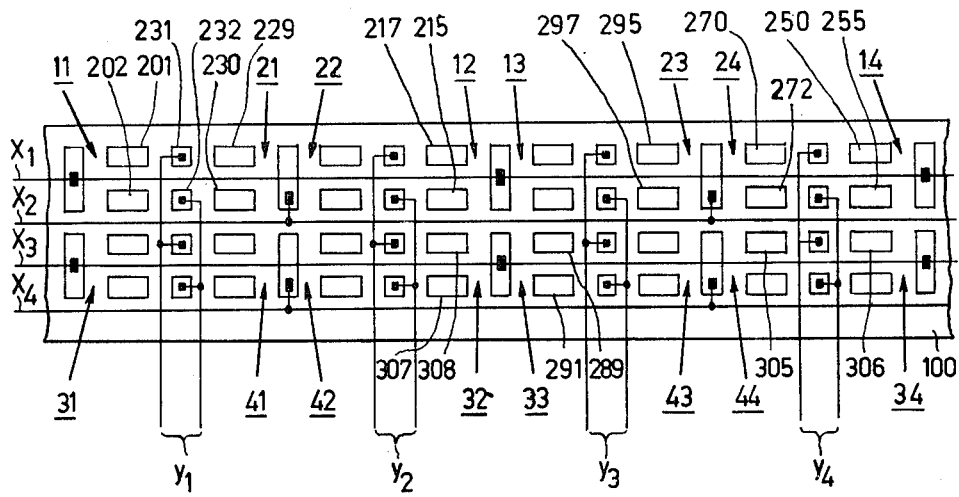
Figure 9:
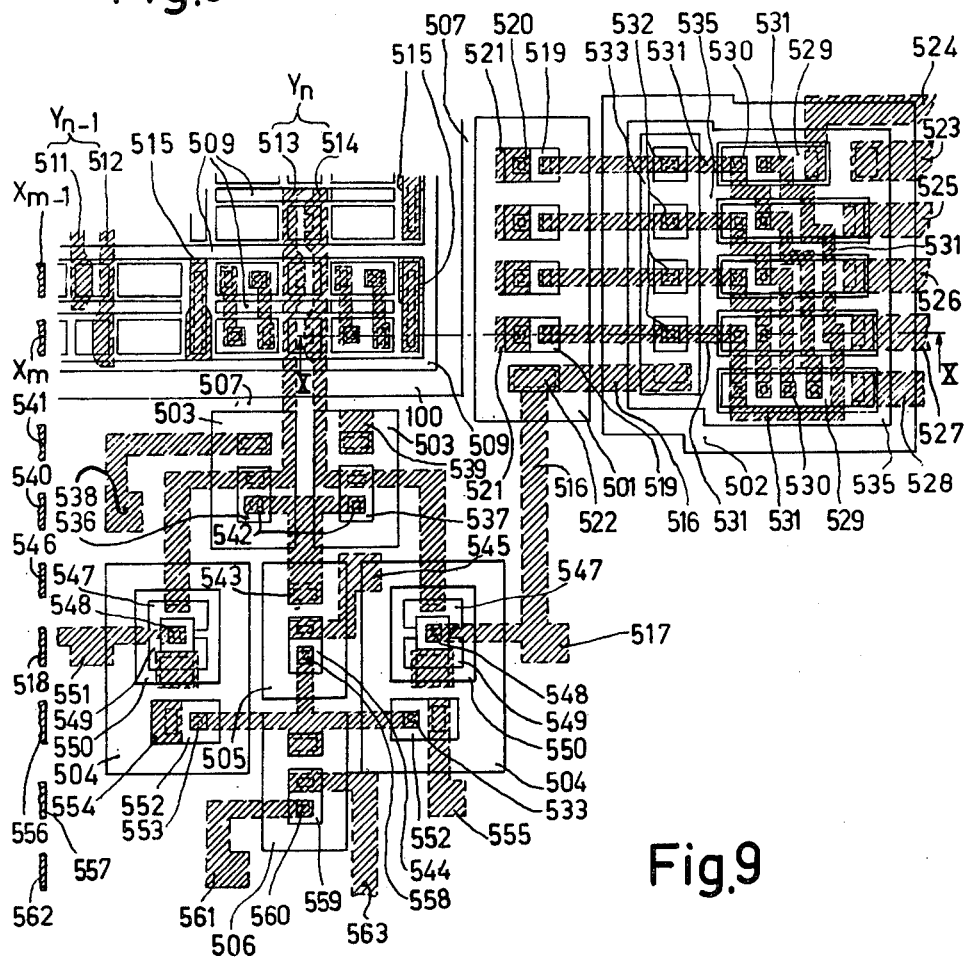
Figure 10:
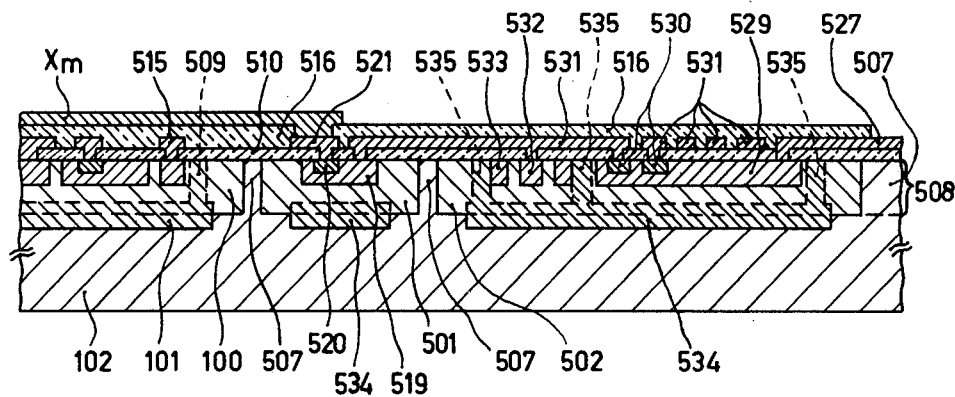

Embodiments of the invention will now be described, by way of example, with reference to the accompanying diagrammatic drawings, in which:

FIG. 1 is a circuit diagram of the memory array according to the invention,

FIG. 2 is a schematic plan view of an integrated embodiment of the memory array according to the invention, FIG. 3 is a schematic cross-sectional view of the integrated embodiment of the memory array of FIG. 1 taken on the line III—III of FIG. 2, FIG. 4 is a schematic plan view of a second embodiment of the integrated circuit according to the invention, FIG. 5 shows in a more elaborate form part of the plan view of FIG. 4, FIG. 6 shows schematically in more detail another part of the plan view of FIG. 4, FIG. 7 is a schematic cross-sectional view of the parts shown in FIGS. 5 and 6 taken on the line VII—VII, FIG. 8 is a schematic plan view of a third embodiment of the integrated memory array according to the invention, FIG. 9 shows schematically in more detail part of the plan view of FIG. 8 and furthermore some integrated selection circuits and an integrated read-write amplifier, FIG. 10 is a schematic cross-sectional view of the embodiment of FIG. 9 taken on the line X—X of FIG. 9, Referring now to FIG. 1, there are shown three memory cells 11, 12 and 21 which are arranged in two rows and two columns. Obviously any suitable amount of cells may be used, however, the present description is restricted to three cells for clarity.

The cell 11 comprises two cross-coupled npn transistors 111 and 112. A load transistor 113 of the pnp type is connected in the collector circuit of the transistor 111, and a load transistor 114 of the pnp type is connected in the collector circuit of the transistor 112. The emitters of the load transistors 113 and 114 in the memory cell 11 are connected to an associated row selection line $X_1$. A bit line $B_0$ is connected via the main current path of a transistor 115 of the pnp type to the base of the transistor 111, and a bit line $B_1$ is connected via the main current path of a transistor 116 to the base of the transistor 112. The bases of the transistors 115 and 116, the bases of the load transistors 113 and 114 and the emitters of the cross-coupled transistors 111 and 112 are interconnected, forming a node 117. The other two memory cells 12 and 21 have the same structure as the memory cell 11. The cell 12 comprises cross-coupled transistors 121 and 122, load transistors 123 and 124 and transistors 125 and 126. The cell 21 comprises cross-coupled transistors 131 and 132, load transistors 133 and 134 and transistors 135 and 136. The nodes 117, 127 and 137 of the memory cells 11, 12 and 121 respectively are directly interconnected and are connected via a current source $S_1$ to a point of reference potential, for example a negative potential $-V$.

The bit lines $B_0$ and $B_1$ are connected to a column selection circuit Y via a read-write amplifier I. The read-write amplifier I comprises transistors 91 to 97. The emitters of the transistors 94 and 97 are connected to a point of reference potential, for example to ground. The collector of the transistor 97 is connected to the base of the transistor 96 and also to the bit line $B_0$. The collector of the transistor 94 is connected to the bit line $B_1$. The emitters of the two transistors 95 and 96 are jointly connected to the collector of the transistor 92. In the embodiment shown the collector of the transistor 95 is connected to a point of reference potential, for example to ground. The collector of the transistor 96, which also is the output 9 of the read amplifier I, is connected to the information output U of the memory array. This output is single-ended. The output of the read amplifier I may, however, have a differential form, using the collectors of the transistors 95 and 96 as the output. The base of the transistor 94 is connected to the collector of the transistor 93. The base of the transistor 97 is connected to the collector of the transistor 91. The emitters of the transistors 91, 92 and 93 are jointly connected to the collector of the transistor 81 of the column selection circuit.

The column selection circuit Y comprises transistors 81, 82, 83 and 84. The collectors of these transistors each form an output of the column selection circuit Y. The collector of the transistor 82 is connected to the information output U via the read-write amplifier II, the collector of the transistor 83 is connected to the information output U via the read-write amplifier III and the collector of the transistor 84 is connected to the information output U via the read-write amplifier IV. The structure of each of the read-write amplifiers II, III and IV is identical to that of the read-write amplifier I. Thus points 14, 15 and 16 correspond to the point 9 of the read-write amplifier I. A bit line pair $B_2$ and $B_3$ adjacent to the bit line pair $B_0$ and $B_1$ is connected to the read-write amplifier II, the bit line pair next to $B_2$ and $B_3$ is connected to the read-write amplifier III, and so on. The emitters of the transistors 81 to 84 of the column selection circuit are jointly connected to a current source $S_2$ the other terminal of which is connected to a point of, for example, negative potential $-V$. The emitter of a chip selection transistor 85 is also connected to the current source $S_2$. The collector of this transistor is connected to a point of reference potential, for example to ground. The integrated memory may be combined with further integrated circuits, which may include similar memory arrays, to form a greater system, the array described being selectable by a signal applied to the base 5 of the transistor 85. If the potential of the base 5 is high, the current from the source $S_2$ flows away through the transistor 85 so that no current is available for reading or writing by means of the read-write amplifiers I to IV. Thus the memory array is isolated from the remainder of the system in respect of information. If on the other hand the potential of the base 5 is low, the information stored in the memory array can be read and/or be replaced by other information.

The collector of the transistor 85 may alternatively be connected to the interconnected nodes 117, 127 and 137. This provides the advantage that in the non-selected condition, i.e. with the base 5 at a high potential, the current from the source $S_2$ is supplied to the memory array and together with the current from the source $S_1$ is available as quiescent or retaining current for the memory cells. This increases the disturbance margin in the quiescent condition.

The row selection line $X_1$ is connected to a row selection circuit X which comprises transistors 70, 71, 72 and 73. The collectors of the transistors 70 and 71, are jointly connected to the base of the transistor 71. The emitters of the transistors 70 and 71 and the collector of the transistor 72 are connected to the base of the transistor 73. The collector of the transistor 73 and the emitter of the transistor 72 are connected to one another and to a point of reference potential, for example to ground. A row selection line $X_2$ is similarly connected to a row selection circuit (not shown) identical in structure to the circuit X. The operation of the memory array shown in FIG. 1 is as follows.

The memory cells are fed via the nodes 117, 127 and 137 by means of the current source $S_1$ which supplies a constant current of E amperes. In the quiescent condition all the memory cells operate at the same current level. Hence a current of $E/n$ amperes is supplied by the current source $S_1$ to each memory cell, where $n$ is the number of memory cells in the array. If, for example, the memory cell 11 is to be selected for reading, by means of the row selection circuit X the row selection line $X_1$ is brought to a potential of for example, $-0.7$ volt. All the other selection lines have been brought to a potential of, for example, $-1.4$ volts. As a result, the current supplied by the source $S_1$ will flow substantially only to the memory cells connected to the said row selection line $X_1$. All the other cells either are switched off or carry exceptionally small currents which to a certain extent depend upon the voltage difference between the selected line $X_1$ and the other row selection lines.

It is assumed that the memory cell 11 contains a logical 0, which means that, for example, the transistor 111 is conducting and the transistor 112 is non-conducting. Because the memory cell 11 is to be read, the base 1 of the transistor 81 of the column selection circuit Y is given a potential of, for example, $-3.5$ volts while the bases 2, 3, 4 and 5 of the remaining transistors of the column selection circuit Y are held at a potential of, for example, $-3.8$ volts. This ensures that the constant current supplied by the current source $S_2$ will flow only through the main current path of the transistor 81 to the read amplifier I. It is further assumed that the presence or absence of a logical 0 in the memory cell 11 is to be ascertained. For this purpose the base 7 of the transistor 92 is given a potential of, for example, $-2.8$ volts while the bases 6 and 8 of the transistors 91 and 93 are given a potential of, for example, $-3.1$ volts. Owing to the applied voltages, in the read amplifier I the transistors 92 and 96 are conducting and the transistors 91, 93, 94, 95 and 97 are cut off. As a result a current will flow through the main current path of the transistor 115 via the bit line $B_0$ to the base of the transistor 96. This current is amplified by the transistor 96, and the amplified current can be derived from the output 9 of the read amplifier I. Thus during reading care is taken to ensure that solely the selected cell operates at a high current level whereas the remaining, non-selected cells operate at a low current level.

If new information is to be written into, for example, the memory cell 11, this is effected as follows. The row selection line $X_1$ is given a potential of, for example, $-1.7$ volts. This ensures that the selected cells only operate at a low current level, whereas the remaining, non-selected cells operate at a high current level. It is assumed that a logical 1 is to be written into the cell 11 (the transistor 112 is conducting). The base 1 of the transistor 81 is given a potential of, for example, $-3.5$ volts while the bases 2, 3, 4 and 5 of the transistors 82, 83, 84 and 85 respectively are given a potential of, for example, $-3.8$ volts. This ensures that the constant current supplied by the source $S_2$ will flow only through the main current path of the transistor 81 to the read amplifier I. The bases 6 and 7 of the transistors 91 and 92 respectively are given a potential of, for example, $-3.1$ volts, and the base 8 of the transistor 93 is given a potential of, for example, $-2.8$ volts. Applying the above-mentioned voltages to the bases of the transistors of the read amplifier I ensures that the transistors 91, 92, 95, 96 and 97 will be cut off while the transistors 93 and 94 are conducting. As a result, the current flowing through the main current path of the transistor 81 will flow through the main current path of the transistor 93 to the base of the transistor 94. This current is amplified by the transistor 94, and the amplifier current flow to the bit line $B_1$. This current will be equally divided between the transistors 116, 136, etc. connected to the bit line $B_1$. The current causes the logical 0 present in the memory cell 11 operating at a low current level (the transistor 111 is conducting) will be overwritten. This means that the transistor 112 will become conducting and the transistor 111 will be cut off. Thus a logical 1 has been written into the memory cell 11. The amplified current, however, is not capable of overwriting logical information contained in the other memory cells which are connected so the bit-line $B_1$ and operate at a high current level.

FIGS. 2 and 3 show schematically how the memory array shown in FIG. 1 can be manufactured in integrated-circuit form. An n-type layer 100 common to all the memory cells is provided on a $n^+$-type substrate 101. The memory cell 11 further comprises semiconductor regions 200, 201, 202, 203, 204, 212 and 213. The memory cell 12 comprises a semiconductor regions 214, 215, 216, 217, 218, 219 and 220. The memory cell 21 comprises semiconductor regions 228, 229, 230, 231, 232, 233 and 234. The transistor 113 is formed by the regions 200, 100 and 201. The region 200 is the emitter region, the region 100 is the base region and the region 201 is the collector region of the said transistor 113. The regions 200, 100 and 202 together constitutes the transistor 114, the region 200 being the emitter region, the region 100 the base region and the region 202 the collector region of this transistor. The regions 100, 201 and 213 together constitute the transistor 112, the region 100 being the emitter region, the region 204 the base region and the region 213 the collector region of this transistor. The regions 100, 202 and 212 together constitute the transistor 111, the region 100 being the emitter region, the region 202 the base region and the region 212 the collector region of this transistor. The regions 202, 100 and 204 together constitute the transistor 115, the region 100 being the base region of this transistor. The regions 201, 100 and 203 together constitute the transistor 116, the region 100 being the base region of this transistor. The base region 201 of the transistor 112 is connected via a base contact 206 and a conductor connected thereto to the collector contact 209 of the transistor 111. A collector contact 207 of the transistor 112 is connected by a conductor to a base contact 210 of the transistor 111. The region 203 is connected via a contact 208 to the bit line $B_0$, and the region 204 is connected via a contact 211 to the bit line $B_1$. The region 200 is connected via a contact 205 to the row selection line $X_1$. The structure of the cells 12 and 21 is similar to that of the cell 11 described. The transistors used in this embodiment have the advantage of permitting a particularly compact integrated circuit to be realized.

FIGS. 4 and 7 show schematically a second embodiment of the memory array. The cell organisation on the chip is shown schematically in FIG. 4. In this Figure, reference numeral 11 denotes the site of the cell connected to the row selection line $X_1$ and to the bit line pair $Y_1$. The reference numeral 12 denotes the site of the cell connected to the row selection line $X_1$ and to the bit line pair $Y_2$. In general a number $pq$ denotes the site of the memory cell connected to a row selection line $X_p$ and to a bit line pair $Y_q$. From the above it will be seen that the cell organization is different from the electric organization of the memory array, in contradistinction to the embodiment shown in FIGS. 2 and 3. The said different organization enables the integrated circuit to be even more compact. FIG. 4 shows that one current injector is required to every four cells, see for example an injecting region 261 which is used in the cells 11, 12, 13 and 14. In the embodiment shown in FIG. 2, however, one current injector is required for each cell. In addition, the number of contact apertures per cell has been greatly reduced. The cell 14, for example, has contact apertures 253, 254, 259 and 260. Contact apertures 267 and 264 are used both for the cell 14 and for the cell 23, hence there is one contact aperture per cell. The contact aperture 321 to the injecting region 261 serves 4 cells that is ¼ contact aperture per cell. Thus the cell 14 altogether requires 4 + 1 + ¼ = 5¼ contact apertures. In the embodiment shown in FIG. 2, however, each cell requires seven contact apertures, for example the cell 11 requires contact apertures 205, 206, 207, 208, 209, 210 and 211. In addition, in the embodiment of the FIGS. 4 to 7 the p-type areas connected to the bit line pairs $Y_1$ and $Y_4$ have double functions. For example, the p-type areas 262 and 265 are used both for the cell 14 and for the cell 23. By this double use the total amount of p-type areas required in the memory array are reduced by a factor of two with respect to the embodiment shown in FIG. 2 in which the corresponding p-type areas are used for one cell only.

FIGS. 5 and 6 show schematically, slightly enlarged and in more detail, the part enclosed by a broken line 500 in FIG. 4. The integrated circuit has two layers of connecting conductors, FIG. 5 showing the semiconductor regions and the first layer of connection conductors which for clarity are shaded, while FIG. 6 shows the part of the second layer of (shaded) interconnection conductors which lies within the regions 261 and 293 on the one hand and the region 274 on the other hand. In the latter Figure the situation of a few semiconductor regions is shown for the sake of orientation. FIG. 7 shows schematically an associated cross-sectional view of the integrated memory array taken on the line VII—VII of FIGS. 5 and 6. In FIGS. 5 to 7 corresponding parts are designated by the same reference numerals as in FIG. 4.

The memory array may be integrated as a whole in a common semiconductor body, no isolating regions being required, as is shown in FIG. 3. However, it may be of advantage for the array to be provided in its entirety in an isolated island, further isolated islands surrounding the array along the periphery of the chip which contain, for example, simultaneously integrated selection circuits and/or read-write amplifiers. For this purpose the present embodiment is formed with a p-type semiconductor substrate 102 (FIG. 7) and an n-type surface layer 100, a buried n-type layer 111 having a higher doping concentration than the surface layer 100 being provided at the boundary between the substrate 102 and the surface layer 100. The surface layer 100 and the buried layer 111 electrically perform the same functions as the semiconductor chip 100, 101 of FIG. 3. FIG. 7 does not show that the surface layer 100 forms an isolated island which contains the entire array of memory cells. Such isolation is obtainable in known manner by means of p-type isolation regions, by means of an isolating layer which is entirely or partially embedded in the semiconductor chip, by means of grooves or by means of a combination of such known isolating techniques.

A plurality of p-type surface regions, such as regions 280, 282, 286, 262, 255 and 261, are provided in the n-type surface layer. Some of the p-type regions, including the region 255, have an n-type collector region adjacent the surface. In the p-type region 255 this is the collector region 256.

Areas 268, 278 and 281 extend between the rows of cells, while within the cells areas 257 and 284 extend between different p-type regions. The areas serve to suppress undesirable parasitic transistor action and to increase the gain factor $\beta$ of the npn transistors having common emitter regions. The areas may adjoin the adjacent p type regions or, as is shown in FIGS. 5 to 7, may be spaced therefrom. They may comprise embedded isolating layers or may even be replaced by grooves. In the present embodiment they take the form of n-type surface regions having a doping concentration higher than that of the adjacent parts of the surface layer 100. Preferably these regions 268, 278, 281, 257 and 284 extend to a depth at least equal to that of the p-type surface regions or, even better substantially to or into the buried layer 101.

The chip surface is coated with an isolating layer 400 in which openings have been made, a first layer comprising a pattern of leads being provided on the isolating layer and in the openings. In the openings the inter-connection conductors form electrical contacts, for example contacts 253, 254, 259, 260, 264, 267, 285 and 287, to the semiconductor regions adjoining the surface at these points. The first layer of interconnection conductors includes a lead 258, which in the cell 14 connects the collector region 256 to the base region 250, the lead 410 which in the same cell connects the collector region 251 to the base region 255, and conductive layers 263, 266, 283 and 288, which serve to connect the regions 252, 265, 282 and 286 respectively to the associated bit lines. The layer further includes leads 320, 324 and 322 which form the lines $X_1$, $X_2$ and $X_3$ respectively and via contacts 321, 325 and 323 are connected to the injecting layers 261, 274 and 293 respectively.

The first layer of interconnection conductors is covered by a second isolating layer 401 on which the bit lines extend in the form of leads 402, 403, 404 and 405. The bit lines are connected through openings 406 in the isolating layer 401 to the conductive layers 288, 282, 263 and 266 respectively situated in the first layer. Obviously the isolating layer 401 may, if required, be formed with at least one opening (not shown) for further connection to the X-lines, because the latter belong to the first layer of interconnection conductors which is covered at least at the site of the array.

FIG. 8 shows the layout or topology of a third embodiment of the memory array according to the invention in integrated-circuit form. For simplicity the sites of the memory cells are indicated by the base regions of the cross-coupled transistors and by the main electrode regions of the lateral coupling transistors connected to the bit lines. Corresponding parts are designated by the same reference numerals as in FIG. 4. Furthermore the cells themselves are numbered 11, 12, 13 etc. similarly to the preceding embodiments.

In this layout also, the cells are arranged in an array, however, this topologic array differs from the electric array shown in FIG. 1. Compared with the electric array the topologic array has one half of the number of rows and twice the number of columns, however, the electric organisation of the array is unchanged and equal to that of FIG. 1. In the topologic array each row contains groups of two memory cells each, each group having a common injecting region, while the groups alternately belong to one of two successive rows of the electrical array. Hence two X-lines extend across the row of cell groups and are alternately connected to every second injecting region. Furthermore adjacent cells in a row which belong to different but adjoining groups have a common bit line pair. The choice of an arrangement in the topologic array different from that in the electric array which shows the organization ensures that in this case also a larger number of semiconductor regions and/or leads can be used in common for a plurality of cells, so that the integrated array is particularly compact and has a high packing density. In addition, this arrangement enables the spacing between the X-lines and between the bit line pairs Y to be adapted to some extent to the space on the semiconductor chip required for the selection circuits and the read-write amplifiers. The X-lines may be spaced by a smaller distance, because the X-selection requires only simple circuits which each comprise only a small number of circuit elements. For the bit line pairs Y, however, a larger relative spacing is desirable, because provision of the Y selection and of the read-write amplifier required for each column in integrated-circuit from requires a considerably increased amount of surface area of the semiconductor chip.

It should be mentioned that it is known to obtain more compact assembly and common use of semiconductor regions and/or leads by arranging cells in an array in relative mirror-image positions. In such an arrangement, however, the sites and the sequence of the cells in the topologic array remain in direct correspondence to those of the electric array. In the layouts shown in FIGS. 4 and 8 a far more extensive regrouping in respect to siting and sequence of the cells as compared with the electric array is used, which may advantageously be employed in other integrated circuits which contain arrays of circuit elements or component circuits also and which may include, in addition to bipolar circuits, circuits using field effect transistors.

FIG. 9 shows in more detail a small part of the memory array of FIG. 8 together with part of the X-selection and an integrated read-write amplifier. In the following description of this Figure the associated cross-sectional view of FIG. 10 is also referred to.

The integrated circuit has a common substrate 102 which consists, for example, of p-type silicon. The substrate is coated with an epitaxial n-type layer 508 which is divided into a plurality of relatively isolated islands by means of p-type isolating regions 507. The cells of the memory array are provided in a common surface layer constituted by the island 100. In the manner described hereinbefore, low-resistance n-type regions 509 are provided in and between the cells to increase the current gain factor $\beta$ of the npn transistors. The n-type regions 509 extend from the semiconductor surface to a buried layer 101 provided in the island 100. The chip surface is coated with a first insulating layer 510 which carries a pattern of leads which through openings in the layer 510 are connected to subjacent semiconductor regions. The pattern includes the leads required in every cell for interconnecting the circuit elements and the bit line pairs of which FIG. 9 shows a bit line pair $Y_{n-1}$ which comprises leads 511 and 512 and a bit line pair $Y_n$ which comprises leads 513 and 514. The injecting regions further each are provided with a conducting contact 515 to which they are connected by X-lines provided on a second insulating layer 516; for the sake of clarity the positions of two lines, $X_m$ and $X_{m-1}$, only are schematically indicated at the left-hand edge of FIG. 9. The X-lines are connected to the contacts 515 in openings in the insulating layer 516.

For X selection two isolated islands 501 and 502 are provided adjacent the memory array. The island 501 contains a plurality of emitter followers which have a common collector region which can be connected to a point of reference potential, for example to ground, by way of a lead 516 situated in the first layer, a contact area 517 and a lead 518 situated in the second layer. Each of the emitter followers further has a base region 519 and an emitter region 520. The emitter regions 520 are each provided with a conductive layer 521 for connection to one of the X-lines. For example, the line $X_m$ is connected to the emitter 520, 521 of the emitter follower situated nearest to the common collector contact 522.

In this example four X lines are used so that four X selection circuits are required. The four lines can be addressed by means of two signals A and B and their negations $\bar{A}$ and $\bar{B}$. Futhermore a chip selection signal can be used to ensure that in the non-selected condition of the chip the current from the source $S_1$ (FIG. 1) is evenly divided between all the cells, irrespective of an X address which may be applied. For this purpose the island 502 contains five gate transistors and, depending upon the potential applied to this island 502 via the lead 523, serves either as a common collector region or as a common emitter region of the gate transistors. The lead 523 corresponds to that terminal shown in FIG. 1 which is connected to the collectors of the transistors 70 and 71 shown. The signals A, B, $\bar{A}$, $\bar{B}$ and CS (chip selection signal) can each be applied to a base region of one of the gate transistors via leads 524, 525, 526, 527 and 528. In each of the base regions a plurality of surface regions 530 is provided which by means of leads 531 are interconnected in groups, each group serving to enable one of the X-lines to be indicated. Each of the four groups is further connected to one of four collectors 532 of a lateral transistor which has a common base region constituted by the island 502 and a common emitter region 533 which by the lead 516 is connected to the collector of the emitter followers and hence is given any reference potential applied thereto. The said transistor having four collectors constitutes the four transistors 72 (FIG. 1) required for the four selection circuits. Each collector 523 is connected to the base region 519 of one of the emitter followers situated in the island 501. Thus four selection circuits according to the basic circuit diagram shown in the box X in FIG. 1 are obtained.

For completeness it should be mentioned that the islands 501 and 502 each are provided with a buried layer 534 and that in the island 502 each of the base regions 529 and the common emitter region 533 are surrounded by a low-resistance region 535 of the same conductivity type as the island 502 and the buried layer 534.

Depending upon the potential of the lead 523 the gate circuits generate either the OR or the NOR function. These functions influence the distribution of the current from the source $S_1$ in a manner such that when information is read the cells of the selected row have a current level which is high compared with that of the cells of the other, non-selected rows, whereas when new information is written the current level of the cells of the selected row is made low compared with that of the cells in the non-selected rows. This particular manner of selection, in which by the application of a suitable potential either the OR or the NOR function is generated by means of the same semiconductor structure, provides particularly simple and compact selection circuits for X-selection, and the embodiment described may readily be expanded to include more than four rows and more input signals for indicating addresses.

FIG. 9 further shows a read-write amplifier according to the electric circuit diagram as shown for the amplifier 1 in FIG. 1, which is entirely manufactured in integrated-circuit form by a conventional method, the circuit elements being accommodated in isolated island 503, 504 and 505. Owing to the space required for this read-write amplifier at the surface of the chip the bit line pairs are alternately connected to an amplifier situated on one side of the array of memory cells and to an amplifier situated on the opposite side of the array. The transistors 95 and 96 are each accommodated in an isolated island 503. The lead 513 of the bit line pair $Y_n$ is connected to the base region 536 of the transistor 96, and the lead 514 is connected to the base region 537 of the transistor 95. The collector regions of these transistors are provided with, or connected to, a conductive layer 538 and 539 respectively, while the second layer of leads includes leads 540 and 541 which each via a conductive layer 538 or 539 respectively interconnect the corresponding collectors of the transistors 95 and 96 of the various read-write amplifiers. The lead 540 is connected to the output U of FIG. 1. The lead 541 may be connected to an output $\bar{U}$ or may be connected, like the lead 518, to a point of reference potential, for example to ground. The emitters 542 of the transistors 95 and 96 are connected to one another and, via a contact region 543, to the collector region 505 of the transistor 92. The base region 544 of the latter transistor is connected via a conductive layer 545 and a lead 546 situated in the second layer to the bases of the transistors 92 of the other read-write amplifiers. By means of the lead 546 all amplifiers may simultaneously have a signal applied to them which determines whether a selected amplifier is used to read information or to write in new information.

The bit lines 513 and 514 furthermore each are connected to a collector region 547 of a lateral transistor situated in an island 504. The lateral transistors constitute the transistors 97 and 94 of FIG. 1. They each have a base region formed by the island 504, an emitter region 548 and two collector regions 547 and 549 the latter of which is short-circuited to the base region in order to prevent excessive spread in the current gain factor $\beta$ of the transistors 548, 504, 507. Except for their inner sides facing the emitter region 548 the collector regions 547 and 549 are surrounded by a low-resistivity region 550 which forms part of the base region 504. The emitters 548 are connected to the lead 518 via conductive layers 517 and 551.

Each island 504 furthermore contains a transistor which comprises a collector region formed by the island, a base region 552 and an emitter region 553. These transistors constitute the transistors 91 and 93 of FIG. 1. The base regions 552 of these transistors are each connected via a conductive layer 554 and 555 respectively to a lead 556 and 557 respectively situated in the second layer. Via these leads 556 and 557 signals common to all amplifiers may be supplied which determine whether during writing by a selected amplifier a 0 or a 1 is written into the selected memory cell. The emitter regions 553 together with the emitter region 558 of the transistor 52 are connected to the collector region 506 of a Y-selection transistor which is designated 81 in FIG. 1. The transistor 81 has a base region 559 and an emitter region 560. The emitter region 560 is connected to a conductive layer 561 for connection to a lead 562 which is situated in the second layer and enables the read-write amplifiers to be connected to the common current source $S_2$. The Y-selection signal can be applied to the base region 559 via a lead 563. The required Y-selection signals can be derived from input signals A, B, $\overline{A}$, $\overline{B}$, etc. by means of gate circuits in the same manner as described for the X-selection, however, in the present case the input signals cannot be combined with a chip selection signal. If desired a further transistor 85 (FIG. 1) for chip selection may be included in the integrated circuit, enabling all the read-write amplifiers to be simultaneously turned off in that the current from the source $S_2$ is conducted away to ground or to the common node of the cells of the memory array.

It will be clear that the invention is not restricted to the embodiments described but that to one skilled in the art many modifications will be possible without departing from the scope of the invention. Although the read-write amplifiers and the X-selection circuit described are particularly adapted to the memory array described, other circuits may be used to perform their functions. Also, other semiconductor materials, such as germanium, may be used, and the conductivity types may be interchanged if simultaneously the signs of the polarities of the potentials to be applied are reversed. Furthermore other arrangements and/or other geometric shapes may be used in the layout. For example, the circuit elements of the read-write amplifiers described may be differently arranged so that all the amplifiers can be situated at the same side of the memory array.

What is claimed is:

1. An integrated circuit memory array comprising:
   a substrate;
   a surface layer of first conductivity type overlying said substrate and divided into a plurality of discrete areas;
   a plurality of memory cells defined and adjacently disposed in associated rows and columns in a single one of said areas of first conductivity type, each cell comprising two cross-coupled transistors of one conductivity type, each of said transistors having base, emitter and collector regions, and load transistors of the other conductivity type having base, emitter, and collector regions; said base regions of said cross-coupled transistors being surface regions of the second conductivity type, extending in said one area of said surface layer, and separating said collector regions of said cross-coupled transistors from said one area which defines a common emitter region of said cross-coupled transistors; said memory cells in adjacent rows being directly adjacent;
   a bit line, connected to said base region of at least one of said cross-coupled transistors through a bit line transistor;
   said one area of said surface layer of first conductivity type forming a common node, directly interconnecting each of said base regions of said load transistors and each of said emitter regions of said cross-coupled transistors, for each of said memory cells;
   means connected to said node, for supplying a constant current to said memory array, connected to a point of constant potential;
   a row selection line connected to said emitter regions of said load transistors in an associated row of memory cells;
   a column selection circuit connected to said bit line for selecting a predetermined column of said memory array; and
   selection means for controlling the level of array current which flows to respective selected and unselected ones of said cells.

2. A memory array as defined in claim 1, wherein during write selection said constant array current is greater to said unselected ones than to said selected ones of said cells.

3. A memory array as defined in claim 1, wherein during read selection said constant array current is greater to said selected ones than to said unselected ones of said cells.

* * * * *